(12) United States Patent
Hommen et al.

(10) Patent No.: US 6,979,522 B2
(45) Date of Patent: Dec. 27, 2005

(54) METHOD FOR EXPOSING AT LEAST ONE OR AT LEAST TWO SEMICONDUCTOR WAFERS

(75) Inventors: Heiko Hommen, Dresden (DE); Ralf Otto, Kesselsdorf (DE); Thorsten Schedel, Dresden (DE); Sebastian Schmidt, Dresden (DE); Thomas Fischer, Dresden (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/635,583

(22) Filed: Aug. 6, 2003

(65) Prior Publication Data

US 2004/0029025 A1 Feb. 12, 2004

Related U.S. Application Data

(63) Continuation of application No. PCT/EP02/02029, filed on Feb. 25, 2002.

(30) Foreign Application Priority Data

Feb. 23, 2001 (EP) .................. 01104358

(51) Int. Cl.$^7$ ............. G03F 9/00; G03C 5/00
(52) U.S. Cl. ........................... 430/22; 430/30
(58) Field of Search ................... 430/22, 30

(56) References Cited

U.S. PATENT DOCUMENTS

| | | | |
|---|---|---|---|
| 5,798,530 A | 8/1998 | Okumura | |
| 5,863,680 A | 1/1999 | Kawakubo et al. | |
| 5,877,861 A | 3/1999 | Ausschnitt et al. | |

FOREIGN PATENT DOCUMENTS

EP 0 044 450 A1 1/1982

*Primary Examiner*—Christopher G. Young
(74) *Attorney, Agent, or Firm*—Laurence A. Greenberg; Werner H. Stemer; Ralph E. Locher

(57) ABSTRACT

A batch of semiconductor wafers are exposed after an alignment in a wafer stepper or scanner and each of their alignment parameters are determined. Using, e.g., a linear formula with tool specific coefficients, the overlay accuracy can be calculated from these alignment parameters in advance with a high degree of accuracy as if a measurement with an overlay inspection tool had been performed. The exposure tool-offset can be adjusted on a wafer-to-wafer basis to correct for the derived overlay inaccuracy. Moreover, the alignment parameters for a specific wafer can be used to change the tool-offset for the same wafer prior to exposure. The required inspection tool capacity is advantageously reduced, the wafer rework decreases, and time is saved to perform the exposure step.

14 Claims, 4 Drawing Sheets

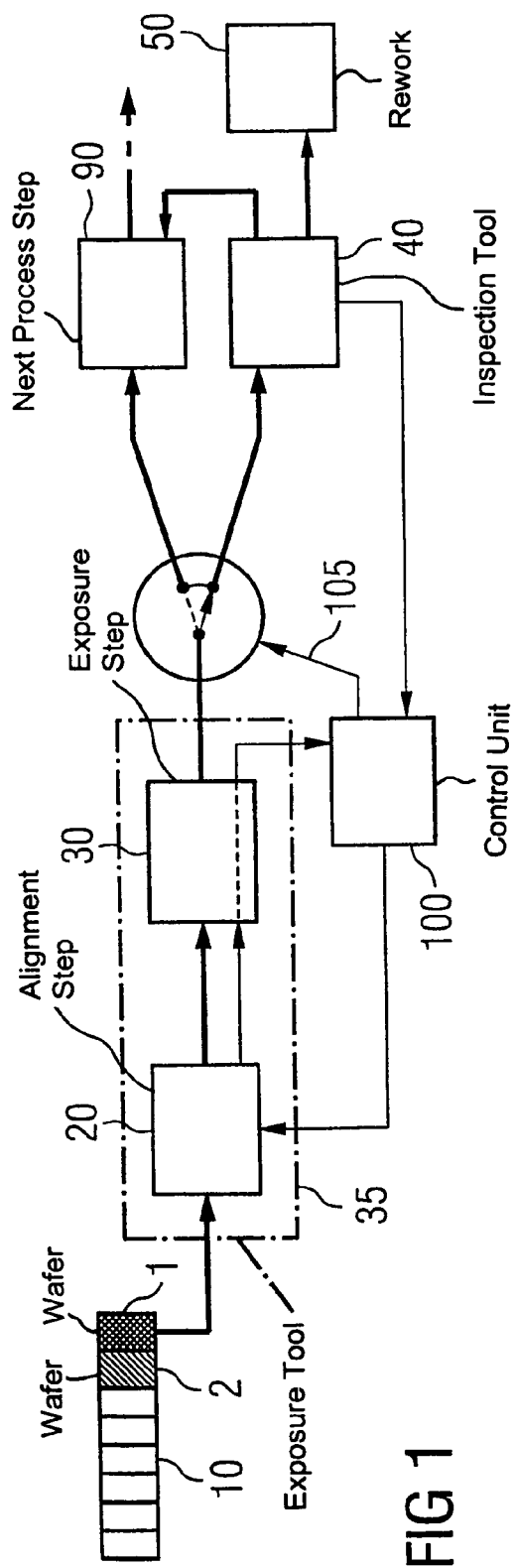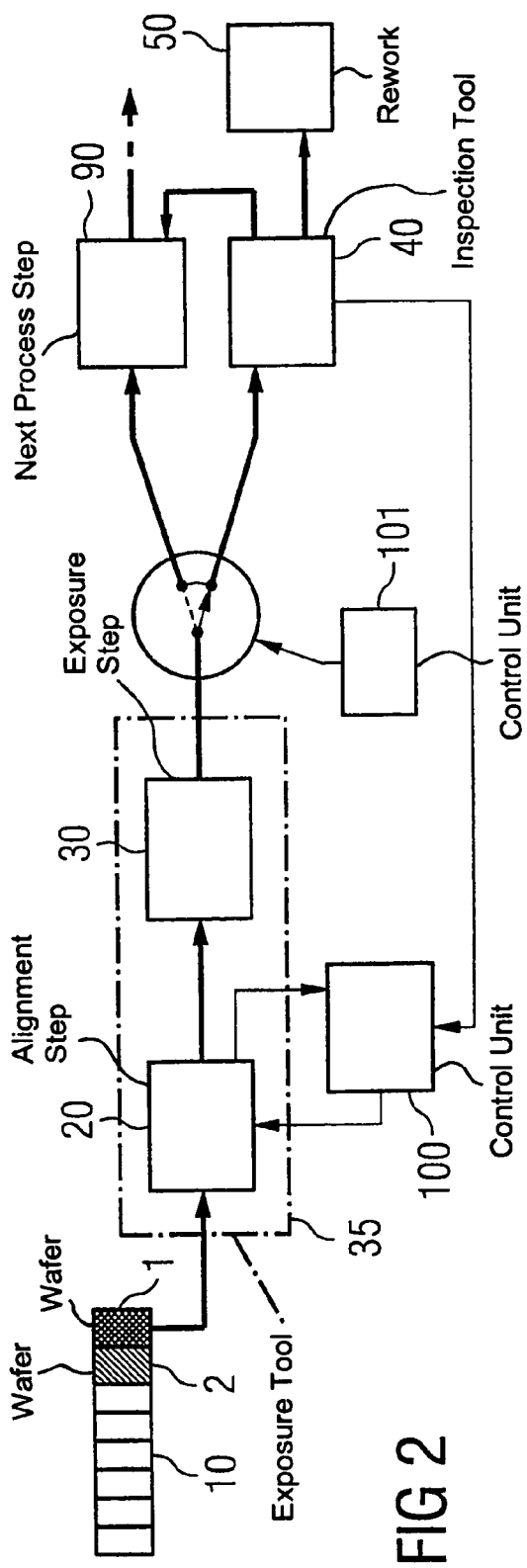

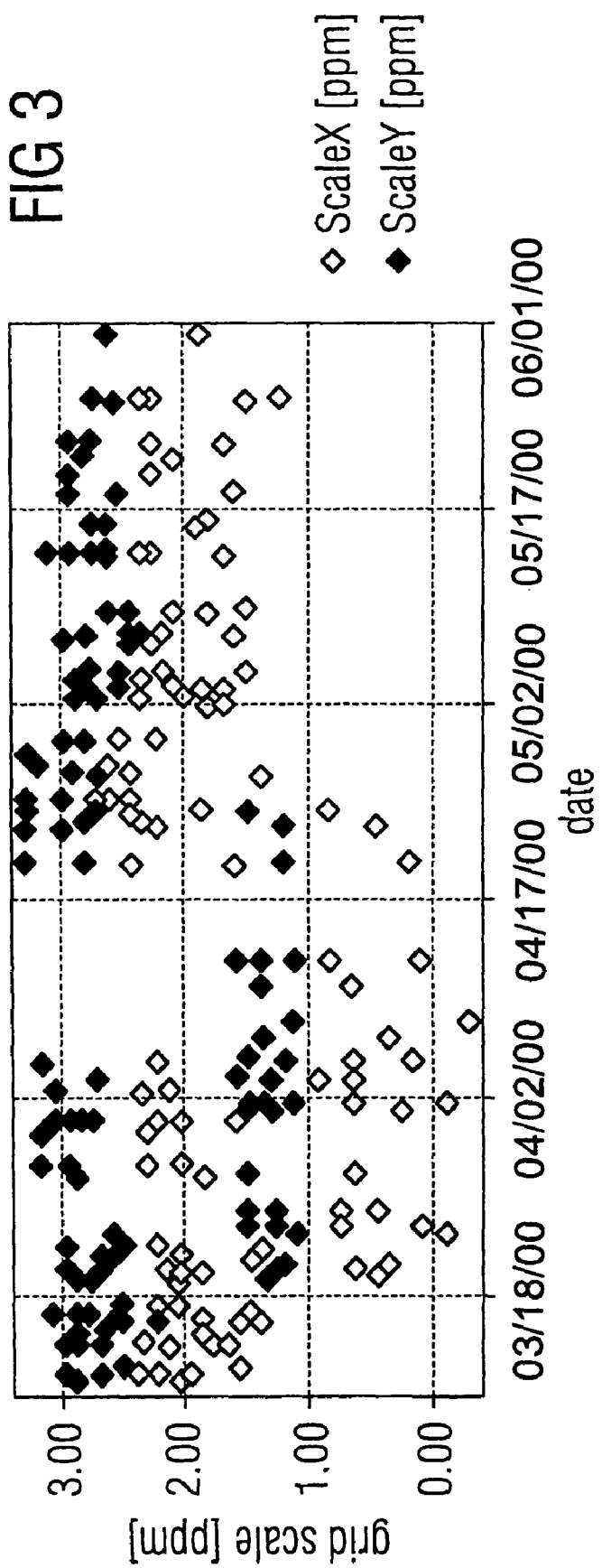

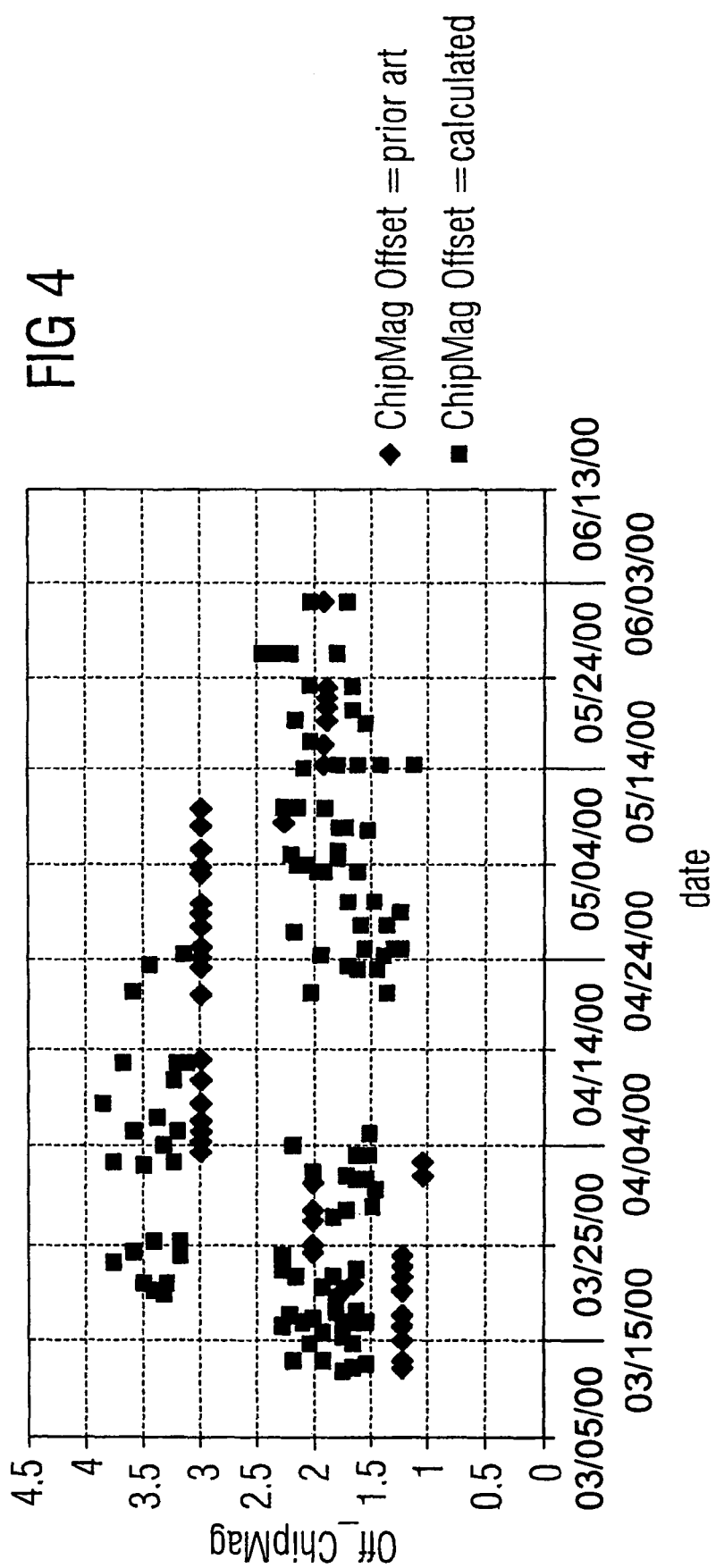

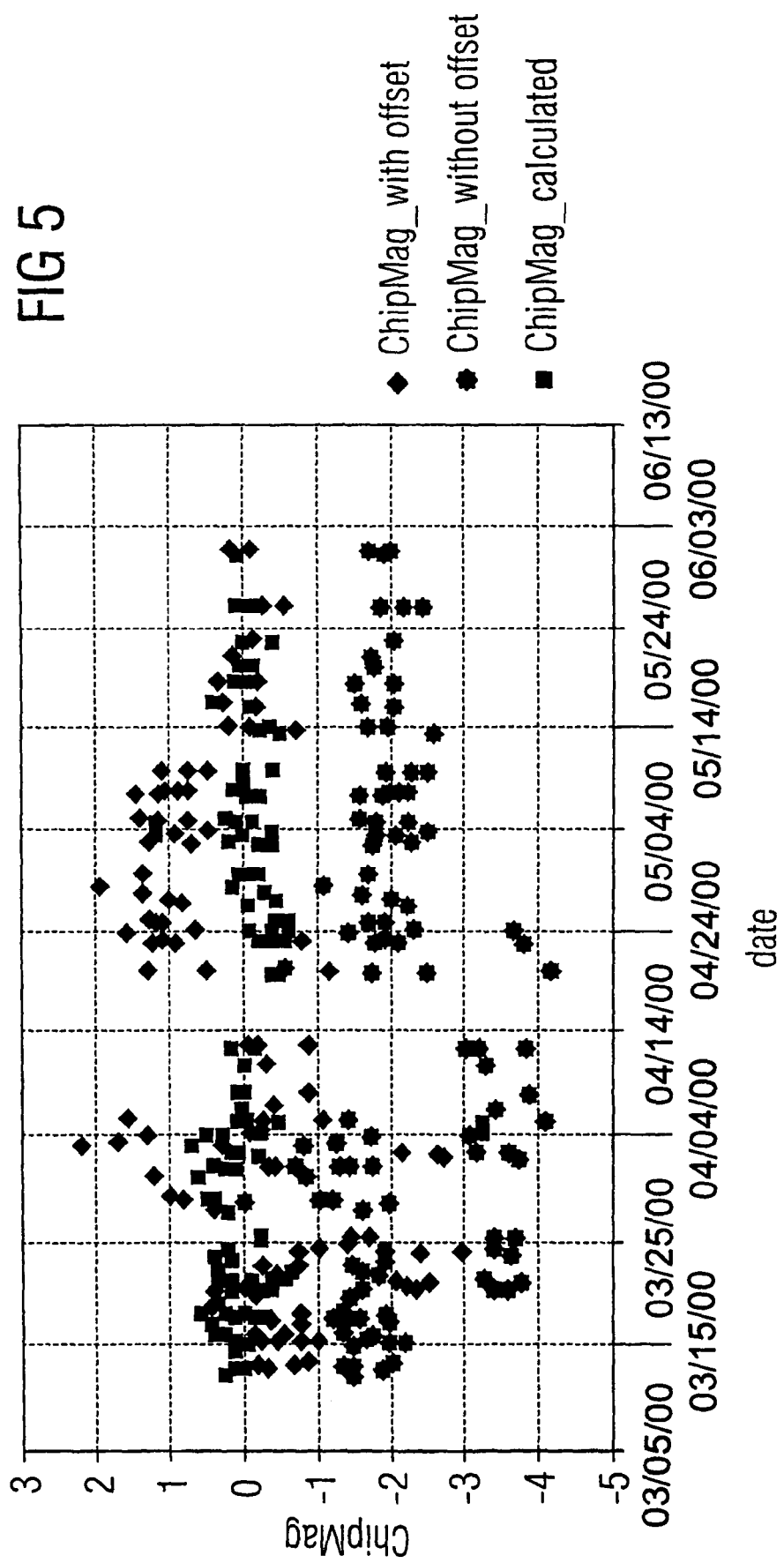

METHOD FOR EXPOSING AT LEAST ONE OR AT LEAST TWO SEMICONDUCTOR WAFERS

CROSS-REFERENCE TO RELATED APPLICATION

This application is a continuation of copending International Application No. PCT/EP02/02029, filed Feb. 25, 2002, which designated the United States and was published in English.

BACKGROUND OF THE INVENTION

Field of the Invention

The present invention relates to a method for exposing at least two semiconductor wafers with a pattern. The exposure is performed in an exposure tool. An alignment is performed in response to a first set of alignment parameters, which depends on characteristics of each of the wafers, and a second set of alignment parameters, which accounts for an exposure tool-offset. The present invention also relates to a method for exposing at least one semiconductor wafer.

In semiconductor wafer manufacturing, tool and process control is one of the main issues for efficiently outputting devices having a high quality from a manufacturing facility. Typically, process control is performed by measuring some characteristics of a group of wafers, e.g. a lot, after the wafers have been processed in a manufacturing tool. One example is measuring a critical dimension of the semiconductor wafers in a lot after exposure. The lot is usually processed in a batch. Since processing tools and inspection tools are commonly grouped in different parts of a fab, wafers combined in a lot travel through the fab after the batch is finished with processing. Eventually, the wafers of the lot are measured in an inspection tool and the measured characteristics may reveal problems with the processing tool, such as focus, alignment, coating, or development problems in the case of wafers that are processed in a lithographic cluster. These problems can often be fixed by adjusting the tool parameters that are used to process wafers. Accordingly, having adjusted the processing tool setup using the inspection results as an input for correcting tool parameters, the next incoming batch or lot of semiconductor wafers can be processed with improved sets of tool parameters, resulting in an increased production yield.

Usually these measurements in an inspection tool are based on dynamic or static sampling. Typically, not every device in a batch is controlled, rather statistical methods are used to pick out a subsample of the lot for the measurement and the results are feed back for the new incoming batch devices that will be processed. Thereby, it is assumed that the next incoming batch devices being manufactured with improved tool parameters behave in the same manner as the previous batch with respect to the tool parameters, and this might not always be the case.

Using this conventional method of statistical process control (SPC) several further disadvantages arise. One is that the processed wafers of a batch or lot, which have selectively just been measured in an inspection tool and which indicate problems with the process tool setup, all have to be moved into rework because they are each most probably affected by these problems. Therefore, free inspection tool capacity as well as the throughput and yield of the process tool are disadvantageously reduced.

Furthermore, problems with single devices might not be covered, if, e.g., every time only a first wafer in a lot is affected by a problem, but it is not selected for inspection by statistical sampling. In this case the origin of a parameter drift in a process tool might not be recognized, or tool parameters might be adjusted inappropriately in reaction to a measured parameter drift. Thus, expensive process tool capacity is wasted and the time to manufacture a device is disadvantageously increased.

SUMMARY OF THE INVENTION

It is accordingly an object of the invention to provide a method for exposing at least two semiconductor wafers in an exposure tool and a method for exposing at least one semiconductor wafer in an exposure tool, which overcome the above-mentioned disadvantages of the prior art methods of this general type.

In particular, it is an object of the invention to accelerate the throughput of lots or batches of semiconductor wafers in a process tool, to increase the wafer yield, and to save costs in semiconductor wafer manufacturing.

With the foregoing and other objects in view there is provided, in accordance with the invention, a method for exposing at least two semiconductor wafers with a pattern, in which the exposure is performed in an exposure tool. An alignment is performed in response to a first set of alignment parameters that depend on characteristics of each of the wafers, and in response to a second set of alignment parameters that account for an exposure tool-offset. The method includes steps of: providing a first semiconductor wafer to the exposure tool for exposing the wafer; performing an alignment of the first semiconductor wafer, with determining values for the first set of alignment parameters; exposing the first semiconductor wafer using the combination of the first and second sets of alignment parameters; determining values for a set of parameters representing the overlay accuracy of the first pattern on the first semiconductor wafer; adjusting values of the second set of alignment parameters to correct for an overlay inaccuracy of the pattern; and exposing a semiconductor wafer including an alignment in response to the adjusted values.

Using the inventive method, the overlay measurement results of a first semiconductor wafer, which can be determined in several ways, are used to change the tool parameter setup for the following or any other second wafer in a batch. In the context of this invention, the alignment is performed using two sets of alignment parameters. The first set of alignment parameters describes the way, in which an individual wafer is aligned and how the grid of exposure fields is set on the wafer. Examples of such parameters are the chip magnification, shifts in the x- and y-direction, grid scaling in the x- and y-direction, the orthogonality of the x- and y-direction, chip rotation, etc. These parameters are used for wafer steppers and scanners, whereby in the case of scanners, the chip magnification is adjustable in the x- and y-direction separately. Such parameters are determined during an alignment prior to any exposure of a wafer.

The same parameters, but with different values make up the second set of alignment parameters, which accounts for the exposure tool-offset. These offset values are each added to or subtracted from the corresponding parameters of the first set of alignment parameters after the values of the first set have been determined. These tool-offset parameters are used to correct for misalignments during the alignment of the semiconductor wafer.

Having determined the values for a set of alignment parameters representing the overlay accuracy of the pattern on the first semiconductor wafer, which just has been exposed or is to be exposed in the exposure tool, the quality of the alignment performance can be checked. Generally, sets of parameters representing the overlay accuracy can be related to sets of alignment parameters. Therefore, according to the present invention, the values of the second set of tool-offset alignment parameters are adjusted to correct for an overlay inaccuracy of the pattern that either has been exposed or will be exposed in the case when the overlay data reveal values beyond a tolerance level.

The objective can further be solved using a similar method, where the tool-offset parameters can be adjusted using only at least one semiconductor wafer. With each further wafer that is aligned and optionally exposed, the tool-offset parameters can even be further refined. The corrected tool-offset parameters necessarily will lead directly to an improved tool-setup that enables the yield to be advantageously increased. Moreover, the inventive method may be combined with a method similar to the advanced process control in the sense that the present method may be repeated a few times until repeatedly no adjustment of the values of the second set of alignment parameters is necessary, after which the determination step for the values of the set of parameters representing the overlay accuracy can be skipped. Thus, the application of the method of the present invention leads to a situation, where costs can be saved due to a reduced amount of inspection time for wafers after exposure. Furthermore, the increased yield advantageously leads to a decreased throughput time.

In another aspect of the present invention, both the parameters reflecting the overlay accuracy are calculated using a formula and the second set of alignment parameters is adjusted, i.e. the tool-offset alignment parameters, prior to exposing the semiconductor wafer. This aspect of the inventive method has the advantage, that the wafer is not exposed, until the sets of alignment parameters are arranged with values that provide sufficient quality for the eventual exposure. Therefore, the yield is still further increased, the throughput time is even further decreased, and the costs are advantageously reduced.

In a further aspect, the step of determining the values for the set of parameters representing the overlay accuracy is performed by calculating the values from the alignment parameters that have been determined in the exposure tool alignment, i.e. the first set of alignment parameters. This calculation can be based on the fact, that an overlay parameter measured with an inspection tool can also be derived or calculated with a mathematical formula including a combination of alignment parameters of the first set, each of them being supplied with a coefficient, which depends on the exposure tool. This determination is found to recover a sample of measurements of corresponding overlay parameters to a high degree of accuracy. The coefficients have to be determined once for a complete tool-offset and can then be reused until the next complete setup of the corresponding exposure tool is performed. Typically, this is a duration of weeks or months.

Therefore, the overlay parameters are known immediately after the alignment in the exposure tool when the determination of the corresponding alignment parameters is finished. This preferentially happens by way of an alignment measurement. Since the values for the set of overlay parameters are known from the calculation, a measurement with an inspection tool can be skipped resulting in a further reduced wafer throughput time. The second set of alignment parameters, i.e. the tool-offset alignment parameters are then adjusted according to the set of calculated overlay parameters.

In a further aspect, the mathematical formula for calculating the values of the set of parameters representing the overlay accuracy is considered to be a linear function and the coefficient in front of each alignment parameter is dependent on the exposure tool employed. A high degree of accuracy for recovering the overlay measurement results when using a linear function, resulting in an easy and straightforward calculation step. Only a few coefficients are involved in this case.

In a further aspect, the batch queue is stopped as a result of values of the set of the parameters representing the overlay accuracy exceeding threshold values corresponding to tolerance levels. After the batch or lot processing is stopped, system maintenance can be conducted in response to a warning signal that has been issued in this case. After having reset the exposure tool, processing of semiconductor wafers can be continued.

In a further aspect, a second determination of the values of the set of parameters representing the overlay accuracy of the wafer pattern is considered. A warning signal is issued when one of the parameters of the set of parameters representing the overlay accuracy of the pattern increases beyond a predetermined tolerance level. A detailed investigation of the parameters and the reason why the tolerance level has been exceeded, can than be performed by re-measuring values of the overlay parameters, which have previously been calculated using the formula from the first set of alignment parameters.

In a further aspect, each of the at least two semiconductor wafers is processed in a next manufacturing step after being exposed without being inspected in an overlay tool.

In a further aspect, the values for the set of tool-offset alignment parameters are calculated from the set of parameters representing the overlay accuracy using a linear formula. This feature provides a fast feedback for the alignment procedure from the overlay parameter determination.

In a further aspect, a neural network is built using the results of the calculation of the values for the set of parameters representing the overlay accuracy performed by a control unit in comparison with the measurement of the values for the set of parameters representing the overlay accuracy in the inspection tool, for adjusting the formula for calculating the values for the set of parameters representing the overlay accuracy.

Other features which are considered as characteristic for the invention are set forth in the appended claims.

Although the invention is illustrated and described herein as embodied in a method for exposing at least one or at least two semiconductor wafers, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 schematically shows an embodiment of the wafer process flow in lithography as well as the alignment feedback;

FIG. 2 shows an embodiment of the wafer process flow similar to that shown in FIG. 1, but also with an offset adjustment prior to exposure;

FIG. 3 is a diagram of grid scale data in the x- and y-direction measured as a wafer alignment parameter during an alignment for the exposure of DRAM wafers within a period of 3 months versus exposure date;

FIG. 4 is a diagram showing values (diamonds) used in the prior art for the tool-offset parameter chip magnification versus the date for exposing the same DRAM wafers as in FIG. 3, and also showing offset values (squares) for the same parameter that has been calculated using an embodiment of the present invention; and FIG. 5 is a plot of the overlay parameter chip magnification representing the overlay accuracy of a pattern as measured with an KLA overlay inspection tool, with and without an applied tool-offset (diamonds and circles, respectively) in the prior art, and as calculated (squares) according to an embodiment of the present invention, for the same DRAM wafers as in FIG. 3, versus date.

DESCRIPTION OF THE PREFERRED EMBODIMENTS

Referring now to the figures of the drawing in detail and first, particularly, to FIG. 1 thereof, there is shown the wafer flow through processing steps 20, 30, 40, 90 when controlled using an embodiment of the method of the present invention. There, thick arrows denote the physical wafer flow, while narrow arrows denote a flow of information, either signal information and/or the data information corresponding to the sets of alignment parameters. A semiconductor wafer batch queue 10 is provided for exposure. Prior to being exposed in an exposure step 30, a first semiconductor wafer 1 of the batch undergoes an alignment step 20 on the wafer stage inside the exposure tool 35.

After the wafer has been exposed, the wafer alignment parameter data, which are measured during the alignment step 20, are examined in a control unit 100. Thereby, using the wafer alignment parameter data, it calculates the relevant inspection overlay data, i.e. values for the set of overlay parameters representing the overlay accuracy of the pattern that is structured on the first semiconductor wafer 1.

For example, the chip magnification expressed as an overlay parameter is calculated using a linear formula:

$$\text{chip\_mag}_{(overlay)} = 1.24 + 0.50 \cdot \text{scale\_x} + 0.50 \cdot \text{scale\_y} + \text{chip\_mag}_{(align)};$$

where $\text{chip\_mag}_{(overlay)}$ denotes the chip magnification as a parameter representing the overlay accuracy, $\text{chip\_mag}_{(align)}$ denotes the chip magnification as a wafer alignment parameter as determined during the alignment step, scale_x and scale_y denote the grid scaling in x- and y-direction, respectively. The coefficients 1.24, 0.50 and 0.50 are exposure tool-dependent and are fixed for the duration of a typical tool setup.

The calculated overlay parameter values are then each compared with parameter dependent tolerance levels according to the overlay accuracy specification provided for the product. If the calculated overlay data provide sufficient results, i.e. within a tolerance range, the wafer is forwarded to the next process step 90. On the other hand, if the overlay data reveal calculated values that increase beyond the tolerance levels, the wafer is forwarded to an inspection tool 40 for performing a second determination of the overlay parameters, i.e. a measurement. If this measurement actually reveals insufficient overlay quality, the wafer is sent into rework 50, while it can be forwarded to the next process step 90 if the overlay measurement reveals oppositely sufficient overlay accuracy. In the latter case, it might be appropriate to re-determine the calculation formula used in the control unit 100 for determining the values for the set of overlay parameters from the values of the set of wafer alignment parameters. Nevertheless, the new alignment offset can be determined by the control unit 100 according to the measurement results of the inspection tool 40 as described below.

While a warning signal 105 is issued by the control unit 100 for controlling the further processing of the semiconductor wafer 1 as described above, in addition, adjusted values for the set of tool-offset parameters are determined by control unit 100 for the alignment procedure. These values are to be added to the values of the set of wafer alignment parameters that are determined during the alignment step 20. A second semiconductor wafer 2 is then aligned and exposed in the exposure tool 35 using the adjusted tool-offset parameter values as indicated by the dashed line in the exposure unit 30 of FIG. 1. The adjusted tool-offset parameter values correct for a possible misalignment derived by control unit 100 for the first semiconductor wafer 1. The alignment data may also be received by the control unit 100 prior to exposure, but the feedback to the alignment step 20 is only provided for the alignment of the following second semiconductor wafer 2. The exposure of the first semiconductor 1 is performed using the originally given values for the set of tool-offset alignment parameters (the first set of alignment parameters).

Another embodiment of the present invention is shown in FIG. 2. It deviates from the embodiment shown in FIG. 1 by a closed loop feedback from the control unit 100, which performs the wafer alignment parameter determination, the overlay parameter calculation, and the tool-offset parameter adjustment after the alignment 20, but prior to wafer being exposed in exposure step 30. The semiconductor wafer 1 is aligned, while values for the alignment parameters are received by the control unit 100. As in the previous embodiment, the control unit 100 then calculates values for the set of overlay parameters representing the overlay accuracy. Because the semiconductor wafer 1 is not yet exposed and still performing the alignment step 20, the tool-offset alignment parameters can be adjusted in-situ in case the overlay accuracy—and thus the tool-offset—can still be improved for the same first semiconductor wafer 1.

After being exposed, an overlay control can optionally be issued by way of statistical process control (SPC) 101 for performing a statistical verification of the overlay results calculated due to the control unit 100.

A comparison of the inventive method with prior art is given in FIGS. 3–5. As an example, the tool-offset parameter for chip magnification is derived using wafer alignment parameters like the grid scale the in x- and y-direction as the input for the calculation. The grid scaling in both directions for a measurement period of several wafers during a period 3 months is shown in FIG. 3. There, it can easily be seen, that e.g., the grid scaling in y-direction is scattering around each of the two distinct values of about 1.3 and 3 ppm.

It has been found, that altering the grid scaling expressed as an alignment parameter has an influence on the chip magnification expressed as a parameter representing the overlay accuracy. Therefore, the chip magnification—this time expressed as an alignment parameter—can be provided with an offset to correct for the jumps in the grid scaling data.

In FIG. 4, the corresponding tool-offsets, that have been used to provide a conventionally optimum overlay accuracy, are displayed as diamonds. They were fixed at five distinct values for the tool-offset alignment parameter chip magnification, which were: initially 1.3 ppm, then 2 ppm, followed by 1 ppm, followed by 3 ppm and finally 1.9 ppm during the same period of 3 months, and for the same exposure tool and wafers as in FIG. 3.

In FIG. 5, the corresponding diamonds reveal the final outcome for the overlay accuracy with respect to chip magnification. This prior art case is characterized by a large scatter between +2 ppm and −2 ppm in chip magnification. The distinctly set tool-offset parameter chip magnification (diamonds in FIG. 4) provided a linear shift (offset) in FIG. 5 from the data represented by the circles, which represent the measured chip magnification overlay parameter as being measured without an offset applied during the alignment. Thus, the distinctly set offset parameters shifted the measured overlay data advantageously into the tolerance window for overlay, which, e.g., may be represented by a range for chip magnification between −1 ppm and +1 ppm. But this hand-set chip magnification offset cannot impede the large scatter that is obvious from FIG. 5 from the diamonds as well as the circles. In this prior art case, the amount of rework therefore is disadvantageously large.

Using the embodiment of the present invention, e.g. according to FIG. 2, the tool-offset parameter chip magnification may be calculated individually for each wafer. A linear formula is used, given by:

$$\text{chip\_mag}_{(offset)} = 4.21 - 0.44 \cdot \text{scale\_}x - 0.55 \cdot \text{scale\_}y,$$

whereby $\text{chip\_mag}_{(offset)}$ denotes the tool-offset parameter chip magnification, and $\text{scale\_}x$ and $\text{scale\_}y$ denote the wafer alignment parameter grid scaling in x- and y-direction, respectively. The coefficients 4.21, 0.44 and 0.55 have been determined previously in the context of a change of the tool setup, e.g. after a maintenance.

The ideal offset calculated using this formula is displayed as a set of squares in FIG. 4. The data scatter around the conventionally derived tool-offset chip magnification, but because this scatter originates from a correction of the scatter in the chip magnification overlay data, the quality of the overlay results has strongly increased as can be seen by the squares in FIG. 5. All of the values for the overlay chip magnification are within the tolerance level of −1 ppm to +1 ppm. Thus, the yield is advantageously increased and the throughput time efficiently reduced. Moreover, free inspection tool capacity is gained, since the overlay control in most cases can be skipped using the inventive method.

We claim:

1. A method for exposing at least two semiconductor wafers in an exposure tool, the method which comprises:
   providing a first semiconductor wafer to the exposure tool for exposing the first semiconductor wafer;
   aligning the first semiconductor wafer using determined values of a first set of alignment parameters that depend on characteristics of the two semiconductor wafers;
   exposing the first semiconductor wafer with a first pattern using a combination of the first set of alignment parameters and a second set of alignment parameters that account for an exposure tool-offset;
   calculating values of a set of parameters representing an overlay accuracy of the first pattern on the first semiconductor wafer using a formula for each of the parameters of the set representing the overlay accuracy, the formula being a function of each of the alignment parameters of the first set;
   adjusting values of the second set of alignment parameters to correct for an overlay inaccuracy of the first pattern; and
   aligning the second semiconductor wafer in response to the values of the second set of alignment parameters that have been adjusted and exposing the second semiconductor wafer.

2. The method according to claim 1, which comprises:
   providing the formula as a linear function of each one of the alignment parameters of the first set; and
   providing each one of the alignment parameters of the first set with a coefficient that depends on the exposure tool that is used.

3. The method according to claim 2, which comprises:
   constructing a neural network for adjusting the formula for calculating the values of the set of parameters representing the overlay accuracy; and
   comparing the values of the set of parameters representing the overlay accuracy with measured values for the set of parameters representing the overlay accuracy obtained in the inspection tool.

4. The method according to claim 1, which comprises:
   issuing a warning signal when one of the parameters of the set of parameters representing the overlay accuracy of the pattern increases beyond a predetermined tolerance level;
   stopping processing with the exposure tool for conducting system maintenance in response to the warning signal; and
   continuing with processing after resetting the exposure tool.

5. The method according to claim 1, which comprises:
   issuing a warning signal, when one of the parameters of the set of parameters representing the overlay accuracy of the pattern increases beyond a predetermined tolerance level; and
   deriving the set of parameters representing the overlay accuracy of the pattern on the semiconductor wafer for a second time by measuring parameters with an overlay inspection tool after the first semiconductor wafer has been exposed with the pattern.

6. The method according to claim 1, which comprises processing each semiconductor wafer in a next manufacturing step after being exposed without being inspected in an overlay inspection tool.

7. The method according to claim 1, which comprises performing the step of adjusting the values of the second set of alignment parameters by calculating the values of the second set of alignment parameters from the values of the set of parameters representing the overlay accuracy using a formula that is a linear function having a respective coefficient for each of the alignment parameters of the second set of alignment parameters.

8. A method for exposing at least one semiconductor wafer in an exposure tool, the method which comprises:
   providing the semiconductor wafer to the exposure tool for exposing the semiconductor wafer;
   aligning the semiconductor wafer using determined values of a first set of alignment parameters that depend on characteristics of the semiconductor wafer;
   calculating values of a set of parameters representing an overlay accuracy of a pattern on the semiconductor wafer using a formula for each of the parameters of the set representing the overlay accuracy, the formula being a function of each of the alignment parameters of the first set;

adjusting values of a second set of alignment parameters that account for an exposure tool-offset in order to correct for an overlay inaccuracy of the pattern; and aligning the semiconductor wafer in response to the adjusting step using a combination of the first set of alignment parameters and the second set of alignment parameters, and exposing the semiconductor wafer.

9. The method according to claim 8, which comprises:
providing the formula as a linear function of each one of the alignment parameters of the first set; and
providing each one of the alignment parameters of the first set with a coefficient that depends on the exposure tool that is used.

10. The method according to claim 9, which comprises:
constructing a neural network for adjusting the formula for calculating the values of the set of parameters representing the overlay accuracy; and
comparing the values of the set of parameters representing the overlay accuracy with measured values for the set of parameters representing the overlay accuracy obtained in the inspection tool.

11. The method according to claim 8, which comprises:
issuing a warning signal when one of the parameters of the set of parameters representing the overlay accuracy of the pattern increases beyond a predetermined tolerance level;

stopping processing with the exposure tool for conducting system maintenance in response to the warning signal; and continuing with processing after resetting the exposure tool.

12. The method according to claim 8, which comprises:
issuing a warning signal, when one of the parameters of the set of parameters representing the overlay accuracy of the pattern increases beyond a predetermined tolerance level; and deriving the set of parameters representing the overlay accuracy of the pattern on the semiconductor wafer for a second time by measuring parameters with an overlay inspection tool after the semiconductor wafer has been exposed with the pattern.

13. The method according to claim 8, which comprises processing each semiconductor wafer in a next manufacturing step after being exposed without being inspected in an overlay inspection tool.

14. The method according to claim 8, which comprises performing the step of adjusting the values of the second set of alignment parameters by calculating the values of the second set of alignment parameters from the values of the set of parameters representing the overlay accuracy using a formula that is a linear function having a respective coefficient for each of the alignment parameters of the second set of alignment parameters.

* * * * *